United States Patent
Kim et al.

(10) Patent No.: US 8,946,025 B2
(45) Date of Patent: Feb. 3, 2015

(54) MANUFACTURING METHOD OF THIN FILM AND METAL LINE FOR DISPLAY USING THE SAME, THIN FILM TRANSISTOR ARRAY PANEL, AND METHOD FOR MANUFACTURING THE SAME

(75) Inventors: Byeong-Beom Kim, Suwon-si (KR); Je-Hyeong Park, Hwaseong-si (KR); Jae-Hyoung Youn, Hwaseong-si (KR); Jean-Ho Song, Yongin-si (KR); Jong-In Kim, Suwon-si (KR)

(73) Assignee: Samsung Display Co., Ltd. (KR)

(*) Notice: Subject to any disclaimer, the term of this patent is extended or adjusted under 35 U.S.C. 154(b) by 273 days.

(21) Appl. No.: 12/931,516

(22) Filed: Feb. 3, 2011

(65) Prior Publication Data

US 2011/0186843 A1    Aug. 4, 2011

(30) Foreign Application Priority Data

Feb. 3, 2010   (KR) .................. 10-2010-0010156

(51) Int. Cl.
| | |
|---|---|
| *H01L 21/336* | (2006.01) |
| *H01L 21/00* | (2006.01) |
| *H01L 21/84* | (2006.01) |
| *H01L 29/04* | (2006.01) |
| *H01L 29/10* | (2006.01) |
| *H01L 27/14* | (2006.01) |
| *H01L 31/036* | (2006.01) |
| *H01L 23/48* | (2006.01) |
| *C23C 14/14* | (2006.01) |
| *C23C 14/34* | (2006.01) |
| *H01L 23/52* | (2006.01) |
| *H01L 29/786* | (2006.01) |

(52) U.S. Cl.
CPC ............... *C23C 14/14* (2013.01); *C23C 14/34* (2013.01); *H01L 23/52* (2013.01); *H01L 29/786* (2013.01)
USPC ............... 438/268; 438/30; 438/73; 438/151; 438/482; 257/57; 257/72; 257/751

(58) Field of Classification Search
CPC ............................. H01L 29/786; H01L 23/52
USPC ................... 257/57, 751, E29.273, E21.411; 438/268, 158, 34
See application file for complete search history.

(56) References Cited

U.S. PATENT DOCUMENTS

| | | | | |
|---|---|---|---|---|
| 2002/0068372 | A1* | 6/2002 | Kunii | 438/30 |
| 2003/0211668 | A1* | 11/2003 | Takatoku | 438/158 |
| 2004/0016924 | A1* | 1/2004 | Yamada et al. | 257/59 |
| 2006/0267114 | A1* | 11/2006 | Hayakawa et al. | 257/410 |

(Continued)

FOREIGN PATENT DOCUMENTS

| | | |
|---|---|---|
| JP | 06-275620 A | 9/1994 |
| JP | 10-256256 A | 9/1998 |

(Continued)

*Primary Examiner* — Shaun Campbell
*Assistant Examiner* — Thai T Vuong
(74) *Attorney, Agent, or Firm* — Innovation Counsel LLP

(57) ABSTRACT

A method for forming a thin film according to an exemplary embodiment of the present invention includes forming the thin film at a power density in the range of approximately 1.5 to approximately 3 W/cm$^2$ and at a pressure of an inert gas that is in the range of approximately 0.2 to approximately 0.3 Pa. This process results in an amorphous metal thin film barrier layer that prevents undesired diffusion from adjacent layers, even when this barrier layer is thinner than many conventional barrier layers.

13 Claims, 14 Drawing Sheets

(56) References Cited

U.S. PATENT DOCUMENTS

| | | |
|---|---|---|
| 2006/0273348 A1* | 12/2006 | Yoshinaga et al. ............ 257/192 |
| 2008/0123039 A1* | 5/2008 | Lee et al. ...................... 349/139 |
| 2008/0237595 A1 | 10/2008 | Park et al. |
| 2008/0239187 A1* | 10/2008 | Yang et al. ...................... 349/44 |
| 2008/0303030 A1* | 12/2008 | Sakai et al. ..................... 257/72 |
| 2009/0140258 A1* | 6/2009 | Yoshinaga et al. ............. 257/66 |
| 2009/0152563 A1* | 6/2009 | Hayashi et al. ................. 257/72 |
| 2009/0242881 A1* | 10/2009 | Yoon et al. ..................... 257/43 |
| 2010/0006843 A1* | 1/2010 | Lee et al. ........................ 257/59 |
| 2010/0032667 A1* | 2/2010 | Yamazaki et al. .............. 257/43 |
| 2010/0072495 A1* | 3/2010 | Yamazaki ....................... 257/89 |
| 2010/0187534 A1* | 7/2010 | Nishi et al. ..................... 257/59 |
| 2010/0207121 A1* | 8/2010 | Hino et al. ...................... 257/59 |

FOREIGN PATENT DOCUMENTS

| | | |
|---|---|---|
| JP | 2006-165520 A | 6/2006 |
| JP | 2007-027392 A | 2/2007 |
| JP | 2007-142388 A | 6/2007 |
| WO | 2009/128424 A1 | 10/2009 |

* cited by examiner

MANUFACTURING METHOD OF THIN FILM AND METAL LINE FOR DISPLAY USING THE SAME, THIN FILM TRANSISTOR ARRAY PANEL, AND METHOD FOR MANUFACTURING THE SAME

CROSS-REFERENCE TO RELATED APPLICATION

This application claims priority to, and the benefit of, Korean Patent Application No. 10-2010-0010156 filed in the Korean Intellectual Property Office on Feb. 3, 2010, the entire contents of which are incorporated herein by reference.

BACKGROUND OF THE INVENTION (a) Field of the Invention

The present invention relates to semiconductor fabrication. More specifically, the present invention relates to a manufacturing method of a metal layer, a metal wire for a display panel, a thin film transistor array panel, and a manufacturing method thereof.

(b) Description of the Related Art

Displays such as liquid crystal displays or organic electroluminescent (EL) display devices currently utilize thin film transistor (TFT) arrays to drive their pixels, creating display images. The thin film transistor array panel typically includes a scanning signal line or a gate line transmitting a scanning signal, an image signal line or a data line transmitting an image signal, a thin film transistor connected to the gate line and the data line, and a pixel electrode connected to the thin film transistor.

The thin film transistor includes a gate electrode that is a portion of the gate wire, a semiconductor layer forming a channel, a source electrode that is a portion of the data wire, and a drain electrode. The thin film transistor acts as a switching element, controlling an image signal transmitted to the pixel electrode through the data wire according to a scanning signal applied to the gate electrode through the gate line.

While yielding thin, low-profile displays that also produce high-quality images, TFT array panels nevertheless face challenges. For example, increases in panel size have also resulted in increased signal delay due to the corresponding increase in wiring lengths, and the resulting increase in their resistance and capacitance. Efforts to solve this problem have focused on reducing wire resistance, mainly by using metals such as copper that possess relatively low resistivities.

However, copper has relatively poor contact characteristics with other layers, often necessitating the presence of additional adhesive layers such as silicon to be added between the copper layer and other layers. Furthermore, these adhesive layers must be relatively thick, to prevent the copper wiring from being diffused into the lower layer. Unfortunately, the deposition and etching steps required to form and shape these thick adhesive layers are lengthy, which adds to process time and expense.

The above information disclosed in this Background section is only for enhancement of understanding of the background of the invention and therefore it may contain information that is not in the prior art.

SUMMARY OF THE INVENTION

The present invention provides a thin film transistor array panel and a manufacturing method thereof, that are capable of improving adhesion between a copper layer and a lower layer without using a thick adhesive layer, and while still preventing copper from diffusing into the lower layer.

A method for forming a thin film on a substrate through sputtering according to an exemplary embodiment of the present invention includes forming the thin film at a power density in the range of approximately 1.5 to approximately 3 $W/cm^2$, and at a pressure of an inert gas that is in the range of approximately 0.2 to approximately 0.3 Pa.

The thin film may have an amorphous structure, and the thin film comprise at least one of titanium, tantalum, and molybdenum.

An Rms surface roughness of the thin film may be less than about 0.55 nm.

The inert gas may be either argon or helium.

A metal wire for a display panel according to the present invention includes: a silicon layer formed on a substrate; a barrier layer formed on the silicon layer; and a copper wire formed on the barrier layer, wherein the barrier layer comprises a metal having an amorphous structure, and the metal comprises at least one of titanium, tantalum, and molybdenum.

The substrate may be a glass substrate, and a surface roughness of the barrier layer is less than approximately 0.55 nm.

A magnitude of a stress of the barrier layer may be less than approximately $1.19 \times 10^8$ $dyne/cm^2$.

A method for manufacturing a thin film transistor array panel according to the present invention includes: forming a gate electrode on an insulation substrate; forming a gate insulating layer on the gate electrode; forming a semiconductor on the gate insulating layer; forming an ohmic contact layer on the semiconductor; forming at least one of a data line and a drain electrode on the ohmic contact layer, the drain electrode including an amorphous barrier layer and a copper layer formed on the amorphous barrier layer; forming a passivation layer on the data line and the drain electrode; and forming a pixel electrode on the passivation layer, wherein the pixel electrode is connected to the drain electrode.

The barrier layer may be formed by a sputtering process, the sputtering being performed at a power density in the range of approximately 1.5 to approximately 3 $W/cm^2$, and at a pressure of an inert gas that is in the range of approximately 0.2 to approximately 0.3 Pa.

The barrier layer may comprise at least one of titanium, tantalum, and molybdenum.

An Rms surface roughness of the barrier layer may be less than approximately 0.55 nm.

The ohmic contact layer, the semiconductor, the data line, and the drain electrode may be formed by using one photosensitive film pattern.

A thin film transistor array panel according to the present invention includes: a gate line formed on a substrate; a data line intersecting the gate line; a thin film transistor connected to the gate line and having a drain electrode connected to the data line; and a pixel electrode connected to the thin film transistor, wherein the data line and the drain electrode of the thin film transistor include an amorphous barrier layer and a copper layer.

A surface roughness of the amorphous barrier layer may be less than approximately 0.55 nm.

A magnitude of a stress of the amorphous barrier layer may be less than approximately $1.19 \times 10^8$ $dyne/cm^2$.

The amorphous barrier layer may have a thickness of less than approximately 200 Å.

The amorphous barrier layer may comprise at least one of titanium, tantalum, and molybdenum.

According to an exemplary embodiment of the present invention, the thickness of the thin film may be reduced, which also results in a reduction in process time.

DETAILED DESCRIPTION OF EMBODIMENTS

Figure 1:
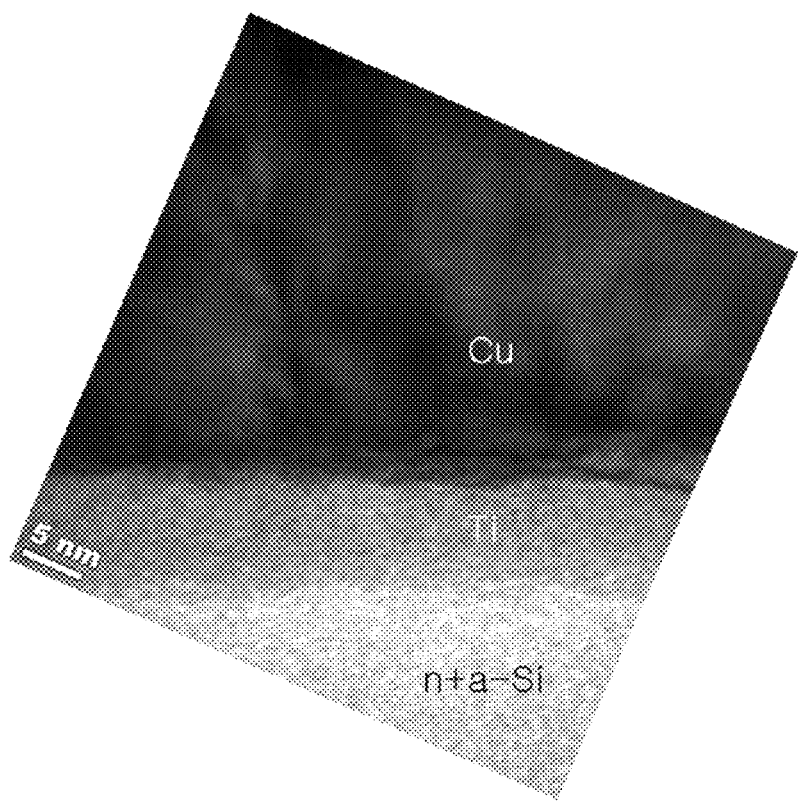
FIG. 1 is a photograph of a triple thin film of an amorphous silicon layer, a barrier layer, and a copper layer according to an exemplary embodiment of the present invention.

The present invention will be described more fully hereinafter with reference to the accompanying drawings, in which exemplary embodiments of the invention are shown.

As those skilled in the art would realize, the described embodiments may be modified in various different ways, all without departing from the spirit or scope of the present invention.

In the drawings, the thickness of layers, films, panels, regions, etc., are exaggerated for clarity.

Like reference numerals designate like elements throughout the specification.

It will be understood that when an element such as a layer, film, region, or substrate is referred to as being "on" another element, it can be directly on the other element or intervening elements may also be present.

In contrast, when an element is referred to as being "directly on" another element, there are no intervening elements present.

FIG. 1 is a photograph of a triple thin film structure that has an amorphous silicon layer, a barrier layer, and a copper layer constructed according to an exemplary embodiment of the present invention. Referring to FIG. 1, the barrier layer is a thin film that is positioned in the middle of the triple thin film, has not been lifted off, has a uniform thickness, and is formed on the amorphous silicon layer. Here, the metal of the thin film forming the barrier layer is made of titanium. However, tantalum or molybdenum may also be used to improve the cohesion of the copper layer and the amorphous silicon layer.

The magnitude of the stress in the barrier layer may have a value of less than approximately 1.19E+8 dyne/cm$^2$. It has been found that, when the stress value is more than this value, the barrier layer is not sufficiently attached to the underlying amorphous silicon and the barrier layer is lifted.

Figure 2:
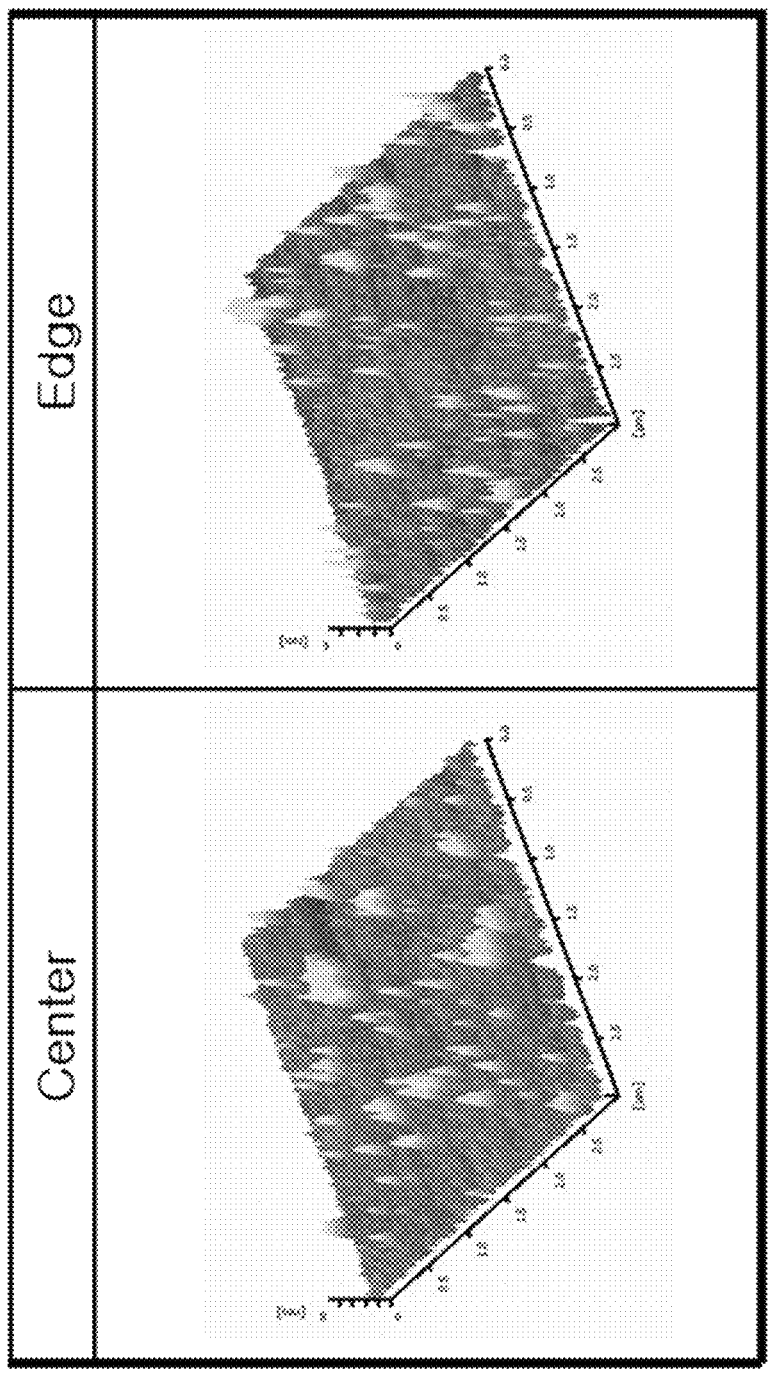
FIG. 2 is a surface photograph of an edge and a central portion of a barrier layer deposited according to a conventional art.
Figure 3:
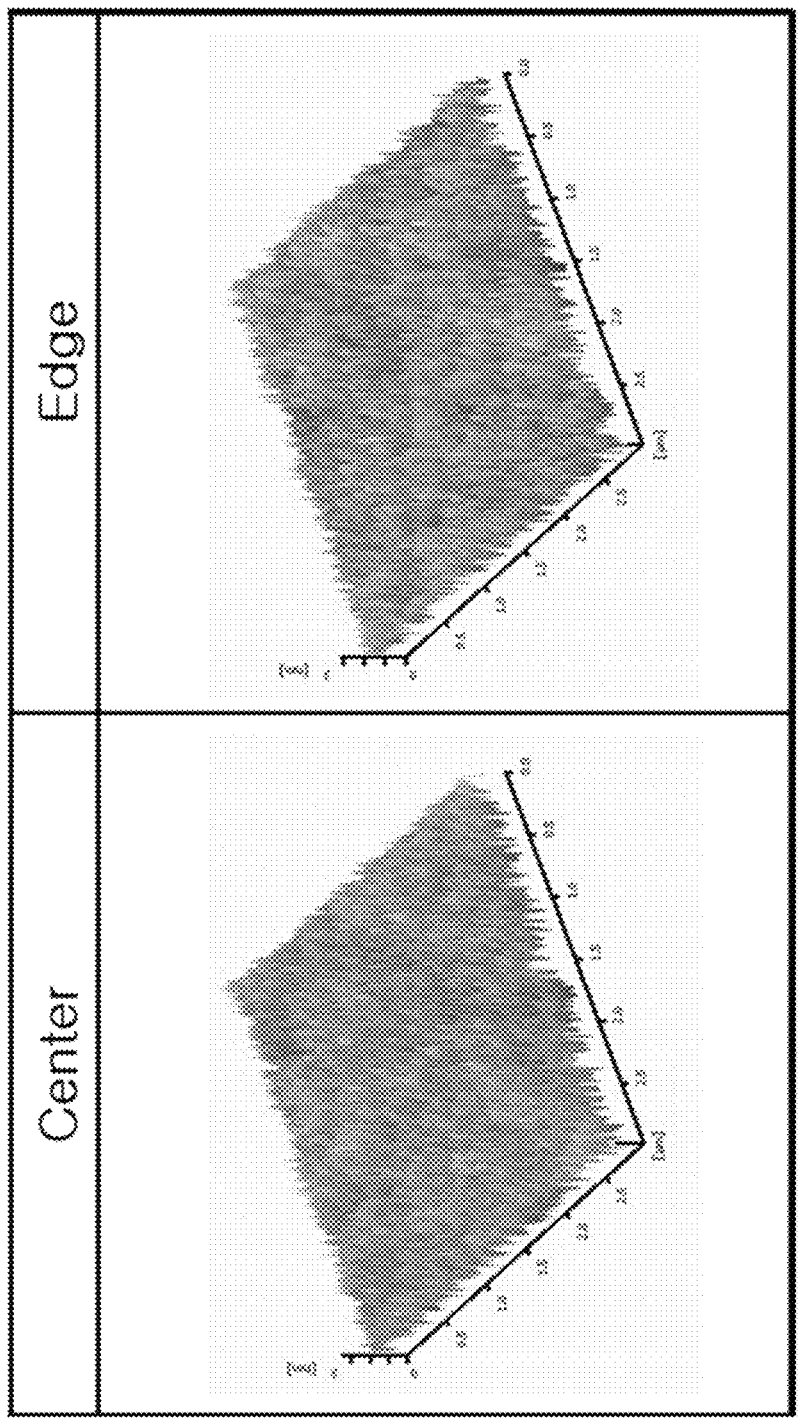
FIG. 3 is a surface photograph of an edge and a central portion of a barrier layer deposited according to an exemplary embodiment of the present invention.

Here, the roughness of the barrier layer is less than 0.55 nm. This may be confirmed through FIGS. 2 and 3, and Table 1. FIG. 2 is a surface photograph of an edge and a central portion of a barrier layer deposited according to the prior art, and FIG. 3 is a surface photograph of an edge and a central portion of a barrier layer deposited according to an exemplary embodiment of the present invention. Table 1 shows roughness values of titanium barrier layers formed according to conventional methods, and according to the present invention. Here, the barrier layer has a thickness of 300 Å.

TABLE 1

| Thin film | Deposition condition | Thickness (Å) | Rms Center | Rms Edge |
|---|---|---|---|---|
| Ti | 3.7 (W/cm$^2$), 0.5 Pa | 300 | 0.9 | 0.7 |
|  | 2.8 (W/cm$^2$), 0.5 Pa |  | 0.52 | 0.51 |

Referring to Table 1 and FIG. 2, when depositing in the condition of 3.7 W/cm$^2$ and 0.5 Pa according to the prior art, the Rms thickness of the central portion of the barrier layer is 0.9 nm and the Rms thickness of the edge portion is 0.7 nm. When depositing in the condition of 2.8 W/cm$^2$ and 0.2 Pa according to an exemplary embodiment of the present invention, the Rms thickness of the central portion of the barrier layer is 0.52 nm and the Rms thickness of the edge portion is 0.51 nm. It can thus be seen that deposition according to this embodiment results in decreased surface roughness as compared with the conventional art. From FIGS. 2 and 3, it can also be seen that this embodiment results in a barrier layer that has more uniform roughness over the entire surface of the deposited layer.

Also, the barrier layer has an amorphous structure, rather than a crystalline structure.

The amorphous structure may mean that the structure of the size corresponding to the crystallization is not measured.

Figure 4:
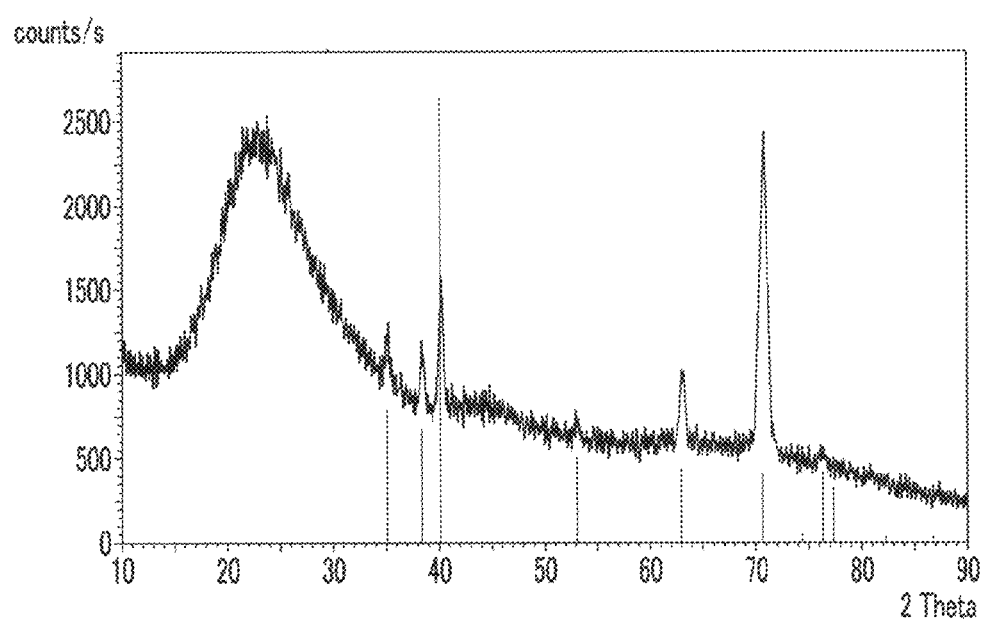
FIG. 4 is a graph of a barrier layer measured by an X-ray diffractometer (XRD) according to a conventional art.
Figure 5:
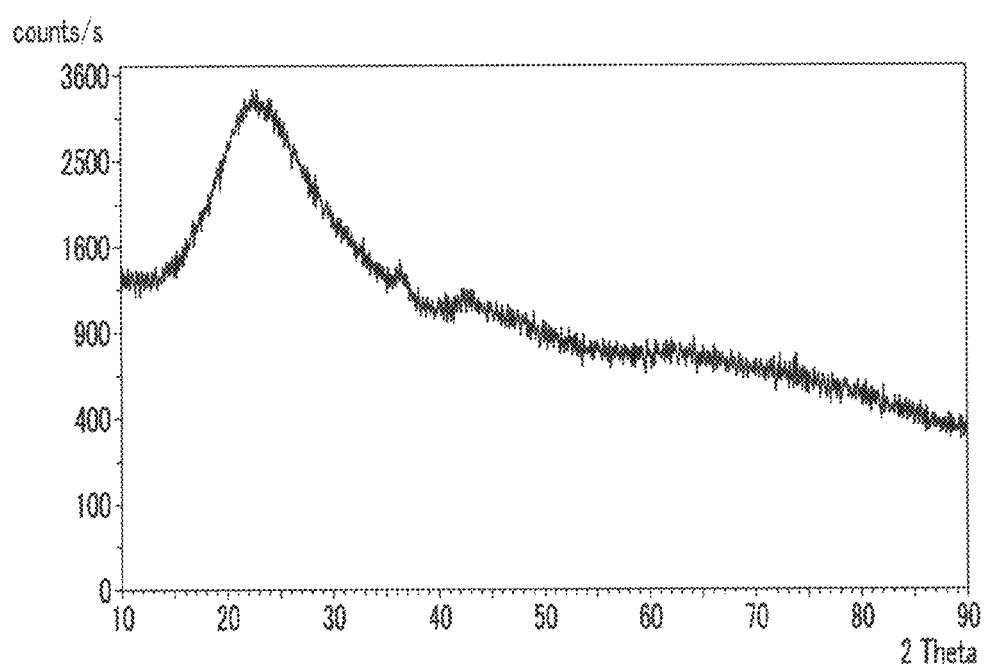
FIG. 5 is a graph of a barrier layer measured by an XRD according to an exemplary embodiment of the present invention.
Figure 6:
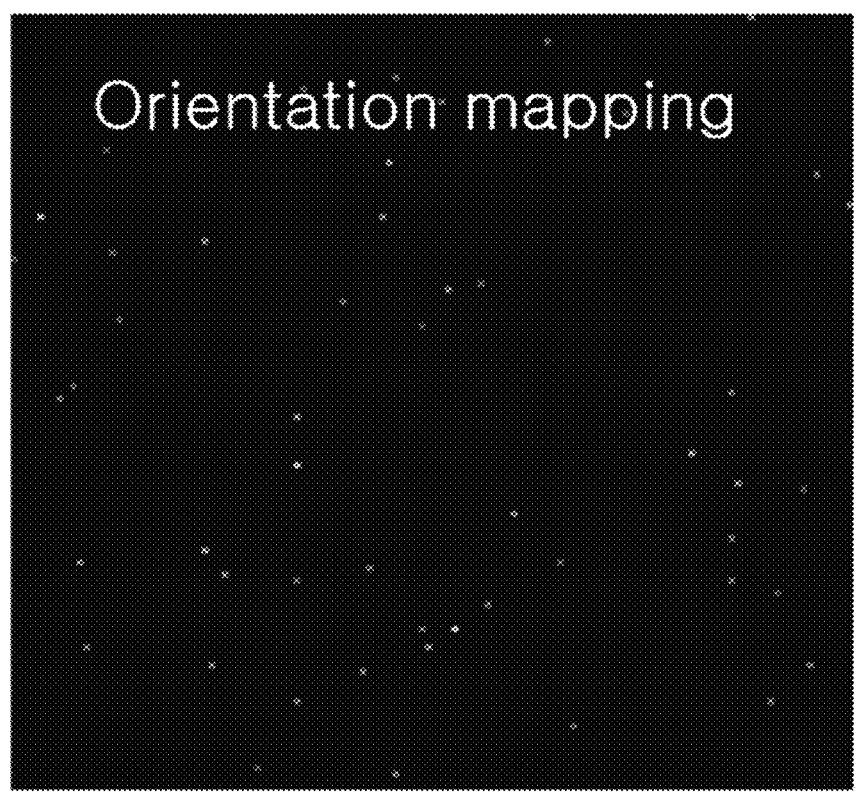
FIG. 6 is a photograph of a barrier layer photographed by electron back scatter diffraction (EBSD) according to an exemplary embodiment of the present invention.

In detail, it may be confirmed from FIG. 4 to FIG. 6.

FIG. 4 is a graph of a barrier layer measured by an X-ray diffractometer (XRD), where the barrier layer has been constructed according to the prior art. FIG. 5 is a graph of a barrier layer measured by an XRD, where the barrier layer has been constructed according to an exemplary embodiment of the present invention. FIG. 6 is a photograph of a barrier layer photographed by electron back scatter diffraction (EBSD), where the barrier layer has been constructed according to an exemplary embodiment of the present invention. In FIG. 4, when the XRD scanned from 10 degrees to 90 degrees, a main peak for a value of 2θ appears near 40 degrees. A corresponding peak does not appear in FIG. 5.

Also, in the graph FIG. 4, peaks having a weaker intensity than the main peak appear near 34 degrees, 53 degrees, 62 degrees, and 70 degrees for 2θ. As with the peak near 40 degrees, corresponding lesser peaks do not appear in the graph of FIG. 5. The absence of these lesser peaks means that the barrier layer of FIG. 5 has an amorphous structure, not a crystalline structure.

Additionally, it is known that an increased amount of black in EBSD photographs indicates a stronger amorphous characteristic of the material being measured. Referring to the photograph of FIG. 6, it may be confirmed that the black occupies a relatively wide area compared with the point that a specific color is represented. Accordingly, FIG. 6 confirms that the barrier layer of the present invention has an amorphous structure.

This barrier layer may be formed though sputtering, and a non-active gas used may be argon or helium. Here, the pressure of the sputtering is in the range of approximately 0.2-0.3 Pa, and the power density may have a value in the range of approximately 1.5-3 W/cm$^2$. When the sputtering power density is less than about 1.5 W/cm$^2$, a discharge for the sputtering may not be generated, and when the sputtering power density is more than about 3 W/cm$^2$, crystallization may occur.

Also, when the pressure is less than about 0.2 Pa or more than about 0.3 Pa, the resulting layer may have insufficient uniformity.

If the barrier layer is formed according to the above-described conditions, the stress of the barrier layer is reduced such that the barrier layer is not lifted.

Table 2 shows the stress values when forming the barrier layer according to the present invention and the conventional art under the conditions shown.

TABLE 2

| | Material | Thickness (Å) | Power density (W/cm$^2$) | Ar pressure (Pa) | Stress (dyne/cm$^2$) |
|---|---|---|---|---|---|
| Conventional art | Ti | 300 | 3.7 | 0.5 | −3.32E+08 |
| Present invention | | | 2.8 | 0.2 | −1.19E+08 |

As shown in Table 2, when forming a titanium barrier layer with a thickness of 300 Å, where deposition is performed at a power density of 2.8 W/cm$^2$ and an argon pressure of 0.2 Pa, the stress value measured is −1.19E+08 dyne/cm$^2$. However, when the power density is 3.7 W/cm$^2$ and the argon pressure is 0.5 Pa as in the prior art, the stress value is a much higher −3.32E+08 dyn/cm$^2$.

Higher magnitudes of stress mean the barrier layer is more easily lifted off. Thus, embodiments of the invention act to reduce the likelihood of undesirable lifting of the barrier layer.

Also, in the prior art, the barrier layer is formed with a thickness more than 300 Å to prevent copper from being diffused into the amorphous silicon.

However, in an exemplary embodiment of the present invention, if the metal layer between the copper layer and the amorphous silicon layer is formed with an amorphous structure, a layer thickness of less than 200 Å is sufficient to prevent the diffusion of copper.

That is, the barrier layer of the present invention prevents the diffusion of copper such that it may be prevent formation of copper silicide even when the layer is thinner than those of the prior art.

Figure 7:
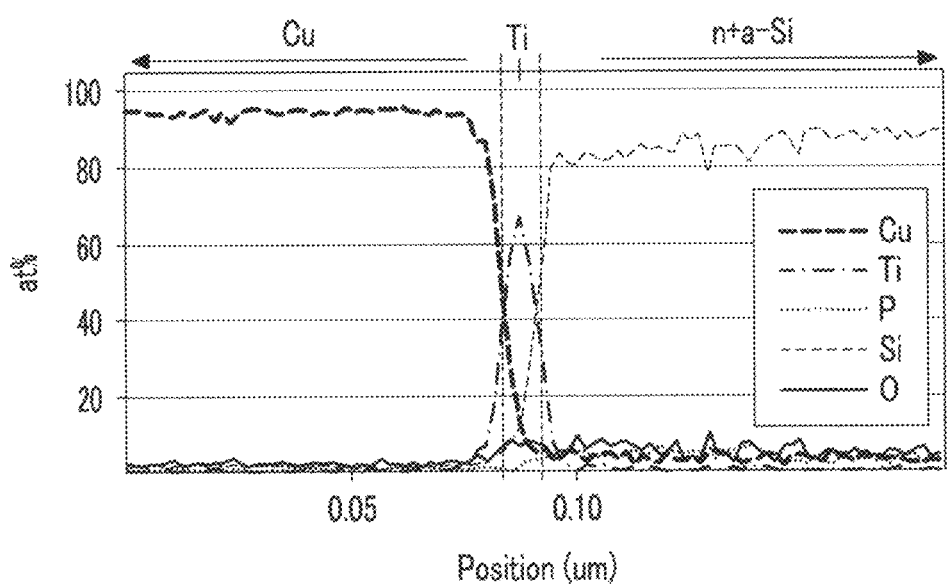
FIG. 7 is a graph for inspecting a component in an amorphous silicon layer, a barrier layer, and a copper layer according to an exemplary embodiment of the present invention.

This may be confirmed with reference to FIG. 7. FIG. 7 is a graph for inspecting a component in an amorphous silicon layer, a barrier layer, and a copper layer according to an exemplary embodiment of the present invention. Here, the barrier layer is made of titanium and the thickness thereof is 100 Å.

As shown in FIG. 7, silicon and copper were not detected outside the amorphous silicon layer and the copper layer respectively, meaning that essentially no copper or silicon has diffused out of either the copper layer or the amorphous silicon layer.

It has thus been found that a titanium barrier layer formed according to the invention is sufficient to prevent diffusion of copper, even when the barrier layer is as thin as 100 Å. That is, the invention allows for prevention of diffusion with a barrier layer that is thinner than the corresponding barrier layers of the prior art. Such thinner barrier layers save process time and expense.

Next, a thin film transistor array panel including the barrier layer formed through the above-mentioned method will be described with reference to FIGS. 8 and 9.

Figure 8:
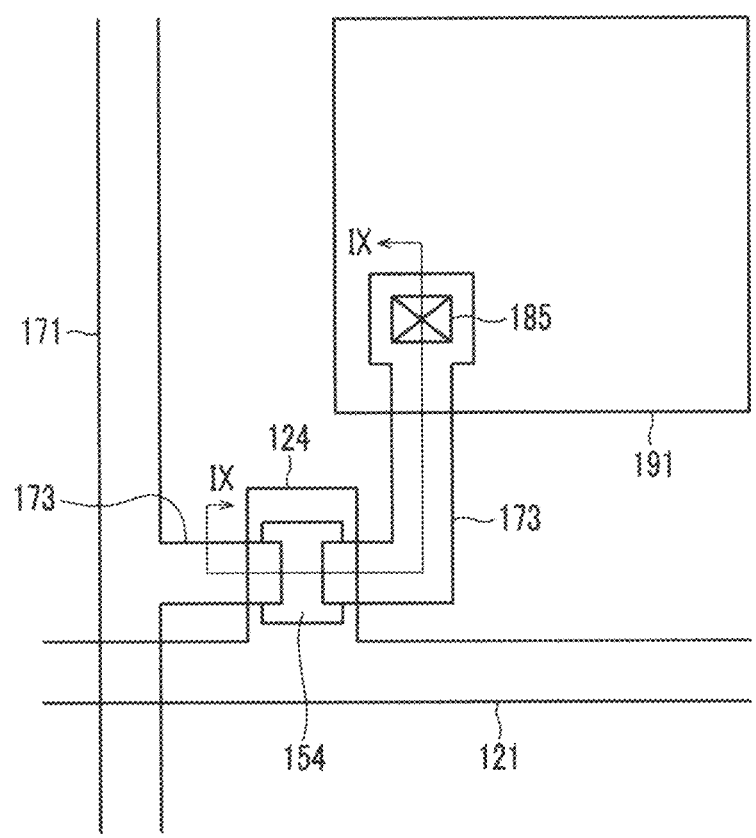
FIG. 8 is a layout view of one pixel of a thin film transistor array panel according to the present invention.
Figure 9:
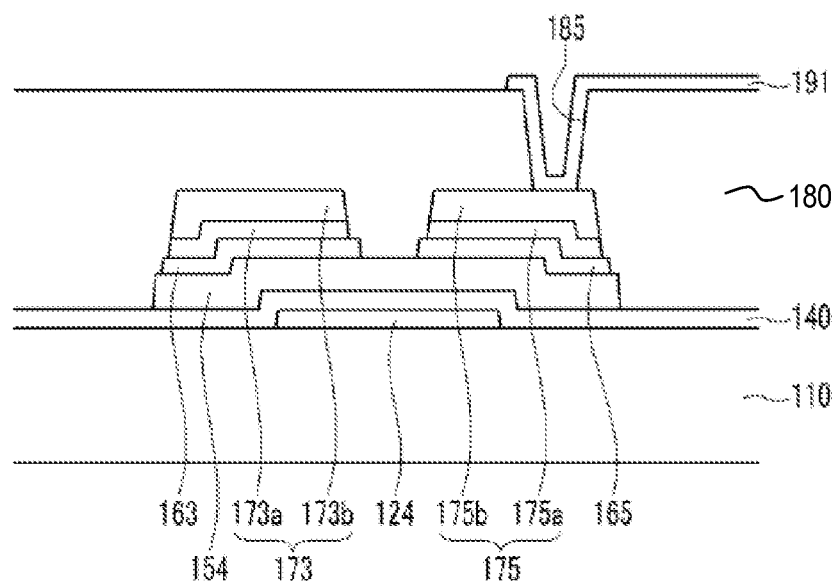
FIG. 9 is a cross-sectional view taken along the line IX-IX of FIG. 8.

FIG. 8 is a layout view of one pixel of a thin film transistor array panel according to the present invention, and FIG. 9 is a cross-sectional view taken along the line IX-IX of FIG. 8.

Referring to FIG. 8 and FIG. 9, a plurality of gate lines 121 are formed on an insulating substrate 110 made of transparent glass, plastic, etc.

The gate lines 121 transmit gate signals and extend in a transverse direction. Each of the gate lines 121 includes a plurality of gate electrodes 124 protruding from the gate lines 121, and an end portion (not shown) having a wide area for connecting to other layers or an external driving circuit (not shown).

A gate insulating layer 140 made of silicon nitride (SiNx) is formed on the gate lines 121.

A plurality of semiconductor structures that are made of hydrogenated amorphous silicon (a-Si), polysilicon, or so on are formed on the gate insulating layer 140.

The semiconductor structures extend in the longitudinal direction and include a plurality of projections 154 that are extended toward the gate electrodes 124.

A plurality of ohmic contact stripes and a plurality of ohmic contact islands 165 are formed on the semiconductor. The ohmic contact stripes include a plurality of projections 163, and the projections 163 and the ohmic contact islands 165 are disposed as pairs on the projections 154 of the semiconductor.

A plurality of data lines 171 and a plurality of drain electrodes 175 are formed on the ohmic contact stripes and islands 163 and 165 and the gate insulation layer 140. The data lines 171 transmit data signals and mainly extend in a transverse direction, thereby intersecting the gate lines 121. Each data line 171 includes a plurality of source electrodes 173 extending toward the gate electrodes 124, and an end portion (not shown) with a wide area for connection with a different layer or an external driving circuit.

The drain electrodes 175 are separated from the data lines 171 and face the source electrodes 173 with respect to the gate electrodes 124.

The data lines 171 including the source electrode 173 and the drain electrode 175 may be made of a double-layered structure including upper layers 173b, and 175b made of copper as a metal of low resistance, and lower layers 173a, and 175a made of a metal having good contact properties, such as titanium, tantalum, or molybdenum. In particular, the lower layers 173a, 175a are fabricated according to the process conditions described above. In this manner, the lower layers 173a, 175a act as a barrier layer preventing diffusion of copper (or other metal) from the upper layers 173b, 175b into the semiconductor material below, while also having good adhesion characteristics and being thinner than conventional adhesive layers.

The lower layers have an amorphous structure, as described above.

One gate electrode 124, one source electrode 173, and one drain electrode 175 constitute a thin film transistor (TFT) together with the projection 154 of the semiconductor, and a channel of the TFT is formed at the projection 154 between the source electrode 173 and the drain electrode 175.

The ohmic contacts 163 and 165 are present only between the underlying semiconductor structure and the overlying data lines 171 and drain electrodes 175, thereby reducing contact resistance therebetween.

The projections 154 of the semiconductor include portions between the source electrodes 173 and the drain electrodes 175, and portions that are not covered by the data line 171 and the drain electrode 175.

The semiconductor structures, with the exception of the projections 154, have substantially the same plane shape (i.e., the same shape when viewed in plan view) as the ohmic contacts 163 and 165, and the ohmic contacts 163 and 165 have substantially the same plane shape as the data lines 171 and the drain electrodes 175.

This is because the data lines 171 and drain electrodes 175, the semiconductors 154, and the ohmic contacts 163 and 165 are formed by using a photosensitive film pattern having different thicknesses, as described in connection with the manufacturing method, outlined below.

A passivation layer 180 is formed on the data lines 171, the drain electrodes 175, and the exposed semiconductors 154. The passivation layer 180 may be made of an inorganic insulator such as silicon nitride or silicon oxide, an organic insulator, or an insulator having a low dielectric constant. The passivation layer 180 has a plurality of contact holes 185 exposing the drain electrodes 175.

A plurality of pixel electrodes 191 are formed on the passivation layer 180. The pixel electrodes 191 are electrically connected to the drain electrodes 175 through the contact holes 185, to receive the data voltages from the drain electrodes 175. When a data voltage is applied to a pixel electrode 191 and a common voltage is applied to the common electrode (not shown) of an opposing display panel (not shown), an electric field is generated in the intervening liquid crystal molecules of a liquid crystal layer (not shown). As the pixel electrodes 191 and the common electrode form a capacitor (hereinafter referred to as a "liquid crystal capacitor"), an applied voltage is sustained even after a thin film transistor is turned off.

The pixel electrode 191 and a storage electrode line (not shown) can overlap each other, thereby forming a storage capacitor that enhances the capacity for maintaining the voltage of the liquid crystal capacitor.

The pixel electrode 191 may be made of a transparent conductive material such as ITO or IZO, or a metal having excellent reflectance.

When forming the amorphous barrier layer as shown in an exemplary embodiment of the present invention, the defect rate of the thin film transistor array panel is reduced to about 1.4%, as compared with the conventional art in which the defect rate of the barrier layer is known to be about 7.9%.

Attention now turns to the fabrication of the TFT array panel of FIGS. 8 and 9. FIGS. 10-14 illustrate an exemplary fabrication process for the structure shown in FIGS. 8-9.

FIGS. 10 to 14 are cross-sectional views sequentially showing a manufacturing method of a thin film transistor array panel according to an exemplary embodiment of the present invention, taken along the line IX-IX shown in FIG. 8.

Figure 10:
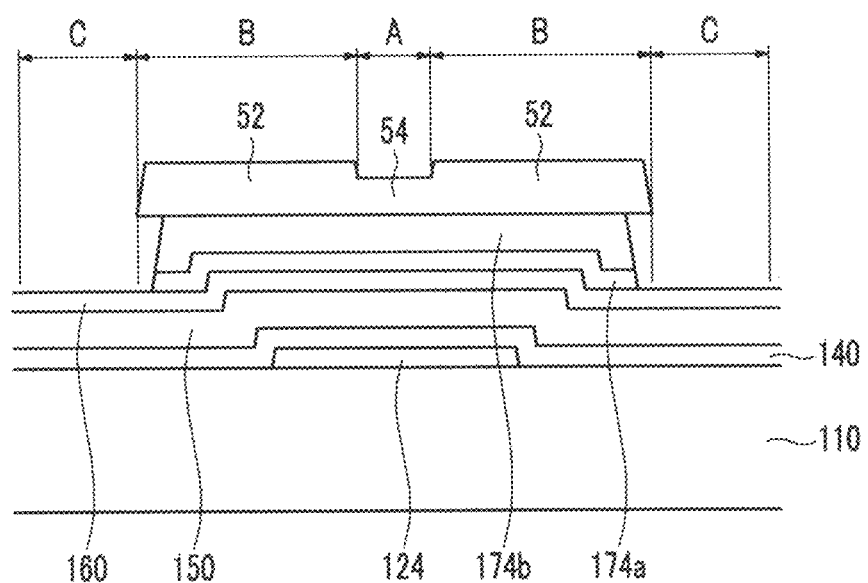
FIGS. 10 to 14 are cross-sectional views sequentially showing a manufacturing method of a thin film transistor array panel according to an exemplary embodiment of the present invention, taken along the line IX-IX shown in FIG. 8.

As shown in FIG. 10, a metal layer is deposited on an insulation substrate 110 made of transparent glass or plastic, and is patterned to form a gate line including gate electrodes 124. The gate line may be made of an aluminum-based metal of aluminum (Al) or aluminum alloys, a silver-based metal of silver (Ag) or silver alloys, a copper-based metal of copper (Cu) or copper alloys, a molybdenum-based metal of molybdenum (Mo) or molybdenum alloys, chromium (Cr), tantalum (Ta), titanium (Ti), or it may be made of any other suitable conductive material.

Also, as shown in FIG. 1 to FIG. 4, the gate line may be made of a double layer structure that includes an amorphous barrier layer and a copper layer.

As shown in FIG. 9 to FIG. 12, the gate insulating layer 140, a first amorphous silicon layer 150, a second amorphous silicon layer 160, a first conductive layer, and a second conductive layer are deposited on the gate electrode 124.

The second amorphous silicon layer 160 is doped with a conductive impurity, the first conductive layer may be formed of titanium having an amorphous structure, and the second conductive layer may be made of copper.

The first conductive layer and the second conductive layer may be made through sputtering.

The first conductive layer is sputtered under a pressure in the range of about 0.2-0.3 Pa and a power density in the range of about 1.5-3 W/cm$^2$, as described above. As above, this allows the first conductive layer to be sputtered to a thickness of as little as approximately 100 Å, while still acting as an effective barrier layer and having good adhesion characteristics.

The inert gas in the sputtering device may be argon or helium.

The second conductive layer may not have the amorphous structure, so that it may be formed with a higher power density than the first conductive layer.

A photosensitive film is coated on the second conductive layer, and is exposed and developed to form photosensitive film patterns 52 and 54 having different thicknesses depending on position.

Portions of the gate insulating layer 140, the first and second conductive metal layers, the first amorphous silicon layer, and the second amorphous silicon layer corresponding to the channel of the wiring are referred to as a channel portion A. Portions of the gate insulating layer 140, the first amorphous silicon layer, the second amorphous silicon layer, the first metal layer, and the second metal layer corresponding to the source electrode and the drain electrode are referred to as a wiring portion B. The remaining portions are referred to as a remaining portion C.

With reference to FIG. 10, the portion of photosensitive film pattern 52 corresponding to the wiring portion B is thicker than the photosensitive film pattern 54 corresponding to the channel portion A, and the photosensitive film is removed on the remaining portion C.

In this case, the ratio of the thickness of the photosensitive film pattern 52 corresponding to the wiring portion B to the thickness of the photosensitive film pattern 54 corresponding to the channel portion A may vary depending on etching process conditions (to be described). However, preferably, the thickness of the photosensitive film pattern 54 is about half the thickness of the photosensitive film pattern 52.

There may be various methods for forming the photosensitive pattern such that portions thereof have different thicknesses according to their positions. For example, an exposure mask can be used that includes a transparent area, a light blocking area, and/or a semi-transparent area. The semi-transparent area can employ a slit pattern, a lattice pattern, or a thin film having median transmittance or having a median thickness. When the slit pattern is used, preferably, the width of the slits or the space between the slits is smaller than resolution of a light exposer used for photolithography.

Another example includes using a reflowable photosensitive film. That is, the method forms a thin portion by making a photosensitive film flow into a region where the photosensitive film is not present after forming the reflowable photosensitive film with a general exposure mask having only a light transmitting area and a light blocking area.

Next, the second metal layer and the first metal layer of the remaining region C are etched by using the photosensitive film pattern 52 and 54 as an etching mask to form a second metal pattern 174b and a first metal pattern 174a. The etching is executed through wet etching, such that an undercut may be formed under the photosensitive film pattern.

Next, a pre-treatment is executed to prevent the side of the exposed second metal pattern 174b from being corroded. The pre-treatment is known, and may be executed by using $O_2$ or another suitable gas, such as a mixture of $SF_6$ and $O_2$.

Figure 11:
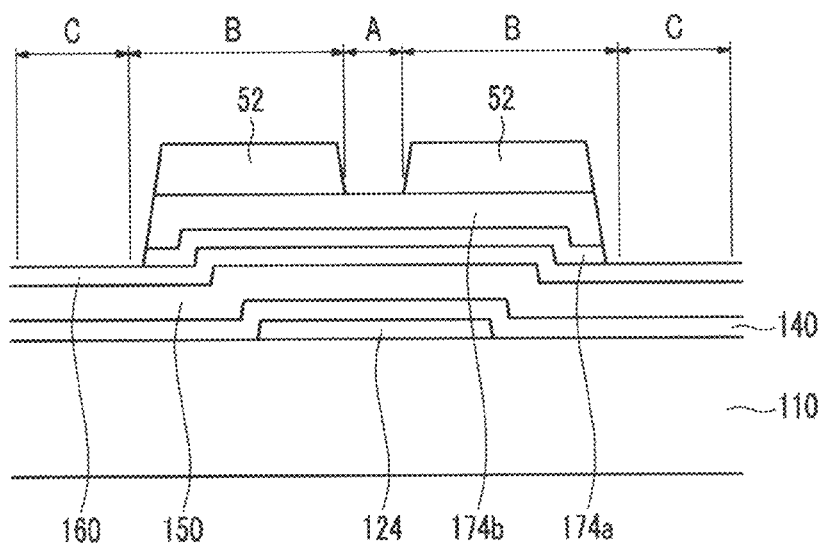

Next, as shown in FIG. 11, the photosensitive film pattern of the channel portion is removed through an etch back process.

Figure 12:
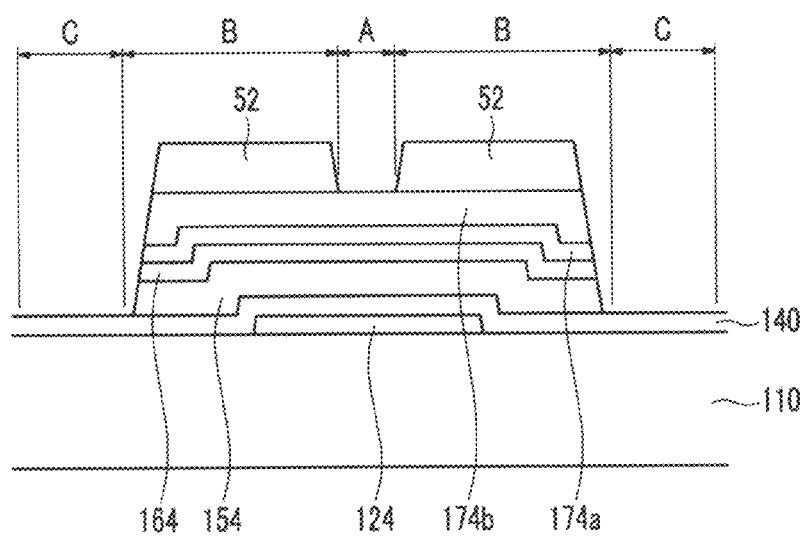

Next, as shown in FIG. 12, the second amorphous silicon layer and the first amorphous silicon layer are etched by using the photosensitive film pattern 52 as an etching mask, so as to form an amorphous silicon pattern 164 and a semiconductor 154.

The second amorphous silicon layer and the first amorphous silicon layer may be etched to form the amorphous silicon pattern 164 and the semiconductor 154 prior to the etch back process. That is, the processes of FIGS. 11 and 12 may be performed in reverse order. However, etching the amorphous silicon layers before etching back the metal layers can result in a larger undercut between the photosensitive film pattern and the metal layers. If instead the etch back process is performed first, the resulting undercut is smaller.

Next, a post-treatment is executed to remove impurities generated during the etch back process and the etching of the amorphous silicon layer. The post-treatment process may use a mixed gas of $SF_6$ and $O_2$.

Figure 13:
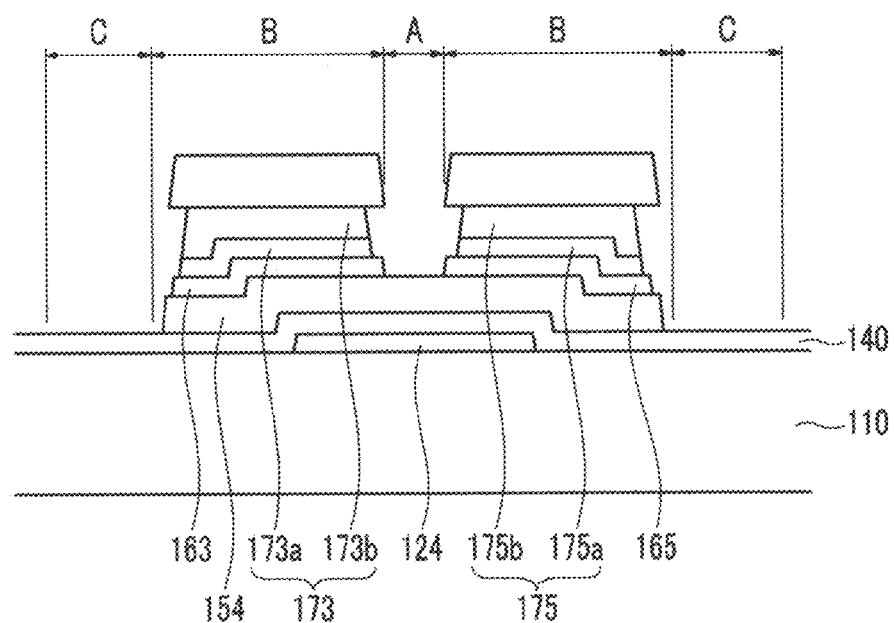

Next, as shown in FIG. 13, the second metal pattern 174b and the first metal pattern 174a are wet-etched by using the photosensitive film pattern 52 as an etching mask, thus forming a source electrode 173 and a drain electrode 175 that include, respectively, upper layers 173b and 175b and lower layers 173a and 175a.

In the case of wet-etching, as the etching time is increased, the taper is smoothed and the size of the undercut is increased. In contrast, a shorter etching time reduces the amount of undercut, and also reduces the amount by which the semiconductor layers 154, 163, 165 protrude beyond the metal patterns 173, 175.

Next, the amorphous silicon pattern is dry-etched by using the photosensitive film pattern 52 as the etching mask to form ohmic contacts 163 and 165.

If photosensitive film patterns having different thickness are used, the data lines 171 (including the source electrodes 173 and the drain electrodes 175) can have substantially the same plane pattern as the ohmic contact stripes having the projections 163, and the ohmic contact islands 165.

Also, with the exception of the exposed portion between the drain electrodes 175 and the source electrodes 173, the projections 154 have substantially the same plane pattern as the source electrodes 173 and the drain electrodes 175.

Figure 14:
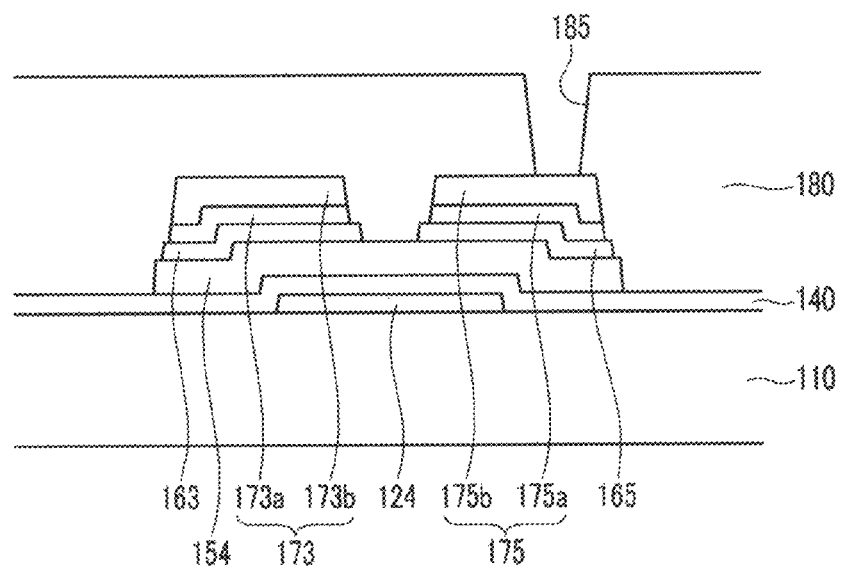

As shown in FIG. 14, a passivation layer 180 covering the exposed portion of the projection 154 of the semiconductor is formed. This passivation layer 180 is then patterned by photolithography to form a contact hole 185 exposing the upper layer 175b of the drain electrode 175.

Next, as shown in FIG. 8, a pixel electrode 191 connected to the drain electrode 175 through the contact hole 185 is formed on the passivation layer 180.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for forming a barrier layer on a substrate through sputtering, comprising:
    forming the barrier layer at a power density in the range of approximately 1.5 W/cm$^2$ to approximately 3 W/cm$^2$, and at a pressure of an inert gas that is in the range of approximately 0.2 Pa to approximately 0.3 Pa, wherein the barrier layer has an amorphous structure, and wherein the barrier layer is disposed between a silicon layer and a copper layer.

2. The method of claim 1, wherein the barrier layer includes a metal that has the amorphous structure.

3. The method of claim 2, wherein an Rms surface roughness of the barrier layer is less than about 0.55 nm.

4. The method of claim 2, wherein the inert gas is either argon or helium.

5. The method of claim 1, wherein the barrier layer comprises at least one of titanium, tantalum, and molybdenum.

6. The method of claim 1, wherein a stress value of the barrier layer is reduced to less than approximately $1.19 \times 10^8$ dyne/cm$^2$.

7. The method of claim 1, wherein the barrier layer has a thickness of less than approximately 200 Å.

8. A method for manufacturing a thin film transistor array panel, comprising:
    forming a gate electrode on an insulation substrate;
    forming a gate insulating layer on the gate electrode;
    forming a semiconductor on the gate insulating layer;
    forming an ohmic contact layer on the semiconductor;
    forming a data line and a drain electrode on the ohmic contact layer, the data line and the drain electrode including an amorphous barrier layer and a copper layer formed on the amorphous barrier layer;
    forming a passivation layer on the data line and the drain electrode; and
    forming a pixel electrode on the passivation layer, wherein the pixel electrode is connected to the drain electrode, wherein forming the data line and the drain electrode further comprises forming the barrier layer by sputtering, the sputtering being performed at a power density in the range of approximately 1.5 W/cm$^2$ to approximately 3 W/cm$^2$, and at a pressure of an inert gas that is in the range of approximately 0.2 Pa to approximately 0.3 Pa.

9. The method of claim 8, wherein the barrier layer comprises at least one of titanium, tantalum, and molybdenum.

10. The method of claim 8, wherein an Rms surface roughness of the barrier layer is less than approximately 0.55 nm.

11. The method of claim 8, wherein the ohmic contact layer, the semiconductor, the data line, and the drain electrode are formed using one photosensitive film pattern.

12. The method of claim 8, wherein the amorphous barrier layer includes a metal that has an amorphous structure.

13. A method for manufacturing a thin film transistor array panel, comprising:
    forming a gate electrode on an insulation substrate;
    forming a gate insulating layer on the gate electrode;
    forming a semiconductor on the gate insulating layer;
    forming a barrier layer on the semiconductor by sputtering, wherein the barrier layer is an amorphous titanium layer;

forming a data line, a source electrode, and a drain electrode, wherein the data line, the source electrode, and the drain electrode include a copper layer;
forming a passivation layer on the data line, the source electrode, and the drain electrode; and
forming a pixel electrode on the passivation layer, the pixel electrode being connected to the drain electrode,
wherein the sputtering is performed at a power density in the range of approximately 1.5 W/cm$^2$ to approximately 3 W/cm$^2$, and at a pressure of an inert gas that is in the range of approximately 0.2 Pa to approximately 0.3 Pa.

* * * * *